United States Patent [19]

Ishitsuka et al.

[11] Patent Number: 5,291,059
[45] Date of Patent: Mar. 1, 1994

[54] RESIN-MOLDED SEMICONDUCTOR DEVICE AND LEAD FRAME EMPLOYED FOR FABRICATING THE SAME

[75] Inventors: Masahiro Ishitsuka; Kazuyuki Hayashi, both of Fukuoka, Japan

[73] Assignee: Mitsubishi Denki Kabushiki Kaisha, Tokyo, Japan

[21] Appl. No.: 943,574

[22] Filed: Sep. 11, 1992

[30] Foreign Application Priority Data

Nov. 18, 1991 [JP] Japan .................. 3-301749

[51] Int. Cl.⁵ .............. H01L 23/48; H01L 29/44; H01L 29/52; H01L 29/60
[52] U.S. Cl. .................. 257/666; 257/676; 257/674
[58] Field of Search ............ 257/666, 676, 667, 698, 257/669, 674, 773

[56] References Cited

U.S. PATENT DOCUMENTS

| | | | |
|---|---|---|---|
| 4,698,660 | 10/1987 | Kubota et al. | 257/696 |
| 4,891,687 | 1/1990 | Mallick et al. | 257/676 |
| 5,089,879 | 2/1992 | Komenaka | 257/676 |
| 5,105,259 | 4/1992 | McShane et al. | 257/667 |

FOREIGN PATENT DOCUMENTS

| | | |
|---|---|---|
| 55-12764 | 1/1980 | Japan . |
| 58-204562 | 11/1983 | Japan . |
| 62-140729 | 9/1987 | Japan . |

*Primary Examiner*—Sheila V. Clark
*Attorney, Agent, or Firm*—Oblon, Spivak, McClelland, Maier & Neustadt

[57] ABSTRACT

A semiconductor device has a lead, an inner lead of which is upwardly bent while an outer lead is downwardly bent. A junction part of the outer lead is guided from a resin block on a level which is lower than that of an upper major surface of the semiconductor chip. In fabrication of this semiconductor device, a guide frame of a lead frame, a suspending lead and a die pad held by the same are flush with each other.

5 Claims, 14 Drawing Sheets

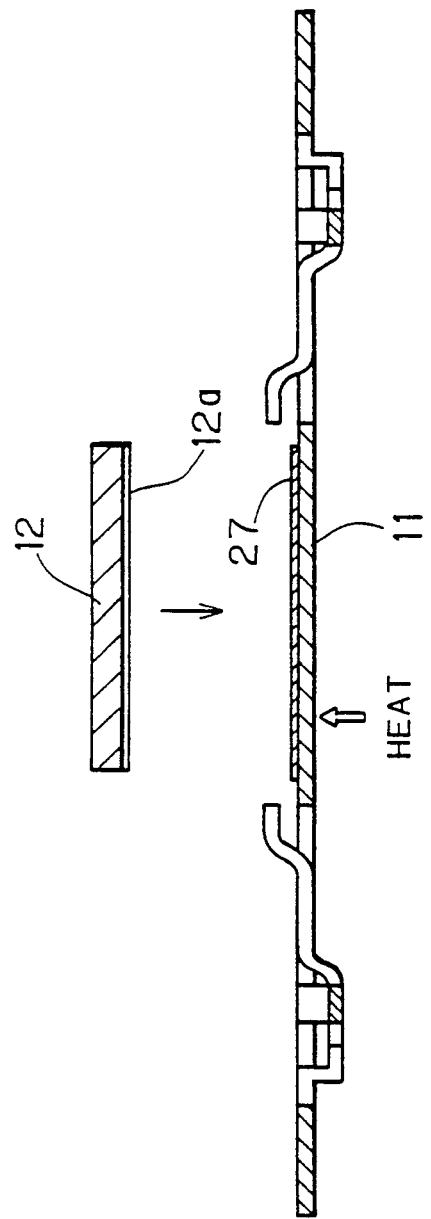

RESIN-MOLDED SEMICONDUCTOR DEVICE AND LEAD FRAME EMPLOYED FOR FABRICATING THE SAME

BACKGROUND OF THE INVENTION

1. Field of the Invention

The present invention relates to a semiconductor device, and more particularly, it relates to a surface-mounted type semiconductor device which is mounted on the surface of a wiring board and a method of fabricating the same.

The present invention also relates to a lead frame which is employed for fabricating the surface-mounted type semiconductor device and a method of fabricating the same.

2. Description of the Background Art

FIG. 14 is a longitudinal sectional view showing a conventional surface-mounted type semiconductor device (TSOP).

Referring to FIG. 14, this semiconductor device 1 comprises a die pad 2, a semiconductor chip 3 which is die-bonded onto the upper surface of this die pad 2 with solder or resin, a plurality of connection leads 5 which are connected to the semiconductor chip 3 through wires 4, and a resin part 6 exposing only end portions of the connection leads 5 and integrally covering the same.

The resin part 6 is so molded as to seal the internal members.

A suspending lead 7 is adapted to stably hold the die pad 2 in respective steps of fabricating the semiconductor device 1.

FIG. 15 is a perspective view showing a semi-finished state of the semiconductor device 1, with the semiconductor chip 3 being die-bonded onto the die pad 2 and completely subjected to a wire bonding step in steps of fabricating the semiconductor device 1.

The die pad 2 is held by a guide frame 8 through the suspending lead 7 while the connection leads 5 are also held by the guide frame 8, whereby the die pad 2 is maintained in constant positional relation with respect to the connection leads 5.

The connection leads 5 are flush with the guide frame 8, while the forward end of the suspending lead 7 is slightly downwardly bent to hold the die pad 2 in a lower position. Therefore, inner leads 5b are substantially flush with the upper major surface of the semiconductor chip 3 as shown in FIG. 14, so that the former can be easily and reliably wire-bonded with the latter.

Respective outer leads 5a and the suspending lead 7 are interconnected with each other through tie bars 9, so that the leads are prevented from misalignment as well as from imperfect junction.

A method of fabricating the aforementioned semiconductor device 1 comprises the following steps:

(1) Lead Frame Forming Step

A metal ribbon material is stamped with a prescribed trimming die, to form a plurality of cells, each comprising the connection leads 5, the suspending lead 7, the die pad 2 and the tie bars 9 in its interior and having the guide frame 8 in its exterior, along the metal ribbon material.

Further, metal molds are applied to the portions of the suspending lead 7 and the die pad 2 to press the same, and the suspending lead 7 is downwardly bent to lower the die pad 2 by an interval substantially corresponding to the height of the semiconductor chip 3 from a guide surface of the guide frame 8.

The metal ribbon material which is continuously provided with such lead frame cells is cut every prescribed number of cells, to form lead frames.

(2) Die Bonding Step

In each of the as-formed lead frames, the semiconductor chip 3 is fixed onto the upper surface of the die pad 2 by a soldering method or a conductive resin bonding method.

(3) Wire Bonding Step

Then, the semiconductor chip 3 is connected with the leads 5 by a thermocompression bonding method or an ultrasonic bonding method through the wires 4 (the state shown in FIG. 15).

(4) Molding Step

The lead frame which is provided and connected with the semiconductor chip 3 is set in a prescribed metal mold, into which resin is injected for molding the resin part 6.

(5) Lead Cutting Step

After the resin part 6 is molded, the outer leads 5a, the tie bars 9 and the suspending lead 7 are cut at portions shown by broken lines in FIG. 15 respectively.

(6) Lead Bending Step

The outer leads 5a are bent in an L-shaped manner as shown in FIG. 14, to form junction parts 5c.

However, the conventional semiconductor device 1 of the aforementioned structure has the following problems:

(a) In the structure of the conventional semiconductor device 1, the outer leads 5a are guided to the exterior from a high position 6a of the resin part 6. Thus, a distance d (FIG. 14) between such a guide portion 6a and each junction part 5c is increased.

In the aforementioned bending step, therefore, it is extremely difficult to form the junction parts 5c of the respective leads 5 to be flush with each other.

Namely, positions of the lower junction parts 5c are extremely influenced by the long legs of the outer leads 5a depending on accuracy of bending angles at shoulder portions 5d thereof, and hence it is extremely difficult to bring the lower surfaces of the junction parts 5c into the same plane. Consequently, some of the junction parts 5c of the leads 5 are upwardly separated from the surface of a substrate on which the semiconductor device 1 is mounted, to cause incomplete connection.

This is particularly problematic for a surface-mounted type semiconductor device. Thus, a semiconductor device having high accuracy in flatness of junction parts 5c has been generally awaited.

(b) On the other hand, it is desirable to substantially equalize resin thicknesses on upper and lower sides of the semiconductor chip 3 as shown by a broken line in FIG. 14, in consideration of heat radiation for effectively radiating heat generated from the semiconductor chip 3 to the exterior as well as protection against deformation for preventing the resin part 6 from thermal deformation by uniformalizing expansion/change of the resin caused by such heat in the upper and lower portions.

When the resin part 6 is formed in such a manner in practice, the resin thickness is reduced in a portion above the inner leads 5b, and strength is reduced in such a portion. When external force is applied to the resin part 6 from above in order to connect the semiconductor device 1 to a wiring board, therefore, the leads 5 may be partially separated from the resin part 6 at the guide portion 6a. Thus, reduction of the resin part 6 has been restricted in the structure of the conventional semiconductor device 1.

(c) In the method of fabricating such a semiconductor device 1, the suspending lead 7 is downwardly bent to lower the die pad 2 in the lead frame forming step as hereinabove described. Thus, the major surface of the die pad 2 is displaced from the guide frame 8 serving as a guide plate, whereby it is impossible to correctly register the suspending lead 7 with dispersion in amount of bending of the suspending lead 7. This leads to incomplete junction of the semiconductor chip 3 and wiring in the die bonding and wire bonding steps.

(d) In the aforementioned fabrication method, further, the steps following resin molding are disadvantageously complicated since the outer leads 5a are bent after the resin molding step.

SUMMARY OF THE INVENTION

A semiconductor device comprises: (a) a die pad, (b) a semiconductor chip having upper and lower major surfaces such that the lower major surface is fixed onto the die pad, (c) a connection lead having elements of (c-1) an inner lead being provided on a side space of the semiconductor chip and having a first part being located on a first level being lower than the upper surface of the semiconductor chip and a second part extending from an end of the first part and being upwardly bent to be located on a second level being higher than the first level such that the second part is electrically connected to the semiconductor chip and (c-2) an outer lead extending from the other end of the first part of the inner lead to be downwardly bent, and (d) a resin block for sealing the die pad, the semiconductor chip and the inner lead with resin.

In order to fabricate the aforementioned semiconductor device, the present invention provides two types of fabrication methods.

A first method of the present invention comprises: (a) a step of stamping a metal thin plate for forming a lead frame comprising a guide frame having a window, a suspending lead being coupled to the guide frame to extend in the window, a connection lead being coupled to the guide frame to extend in the window through a path being different from that of the suspending lead, and a die pad being supported in the window by the suspending lead, (b) a step of bending the connection lead thereby shaping the connection lead into a combination of an inner lead having a first part being located on a first level on a central side of the connection lead and a second part extending from an end of the first part to be upwardly bent to a second level higher than the first level and an outer lead extending from the other end of the first part of the inner lead to be downwardly bent, (c) a step of fixing a semiconductor chip onto the die pad, (d) a step of electrically connecting the semiconductor chip and the second part of the inner lead with each other, (e) a step of sealing the die pad, the semiconductor chip and the inner lead with resin, and (f) a step of separating a part of the suspending lead being covered with the resin from that being covered with no such resin while separating the guide frame from the connection lead.

In a second fabrication method of the present invention, the outer lead is bent after the resin sealing step. Such a step of bending the outer lead and the aforementioned separation step (f) may be carried out in any arbitrary order.

On the other hand, a lead frame of the present invention comprises: (a) a guide frame having a window, (b) a suspending lead being coupled to the guide frame to extend in the window, (c) a die pad being supported in the window by the suspending lead, (d) an outer lead being coupled to the guide frame to extend in the window through a path being different from that of the suspending lead, and (e) an inner lead having elements of (e-1) a first part having an end being coupled to the outer lead to be located on a first level, and (e-2) a second part extending from the other end of the first part and being upwardly bent to be located on a second level being higher than the first level.

When a semiconductor device to be fabricated from this lead frame is mounted on a wiring board through junction of a lap joint system, the outer lead is provided with a part extending from the second part of the inner lead and being downwardly bent while being further bent on a third level being lower than the first level.

A method of fabricating such a lead frame comprises: (a) a step of obtaining a metal thin plate, (b) a step of stamping the metal thin plate for forming a lead frame comprising a guide frame having a window, a suspending lead being coupled to the guide frame to extend in the window, a connection lead being coupled to the guide frame to extend in the window through a path being different from that of the suspending lead, and a die pad being supported in the window by the suspending lead, and (c) a step of bending the connection lead thereby shaping the connection lead into a combination of an inner lead having a first part being located on a first level on a central side of the connection lead and a second part extending from one end of the first part and being upwardly bent to be located on a second level being higher than the first level and an outer lead extending from the other end of the first part of the inner lead.

When a semiconductor device to be fabricated from this lead frame is mounted on a wiring board by soldering of a lap joint system, the step (c) comprises a step of downwardly bending the outer lead to bring the same into a third level being lower than the first level.

According to the present invention, the term "inner lead" indicates a part of the connection lead which is sealed in the resin block, while the term "outer lead" indicates a part of the connection lead which is exposed to the exterior of the resin block.

According to the inventive semiconductor device, a guide position for the outer lead from the resin block is so downwardly provided as to reduce the vertical distance between the guide position for the outer lead and a junction part, whereby flatness of the junction part can be easily ensured.

Since the inner and outer leads are upwardly and downwardly bent respectively, the inner lead can be easily connected to the semiconductor chip, while the guide position for the outer lead from the resin block is downwardly provided to ensure a sufficient resin thickness above the lead. Even if the resin thickness is reduced in a portion above the lead, therefore, it leads to no problem such as partial separation between the lead and the resin block.

According to the first or second inventive method of fabricating a semiconductor device, the guide frame of the lead frame, the suspending lead and the die pad being held by the same are flush with each other, whereby registration accuracy is improved in the die bonding step of fixing the semiconductor chip and the wire bonding step of connecting the semiconductor chip with the inner lead, to cause absolutely no incomplete junction in the fabrication steps.

Particularly in the first method, the outer lead is bent with bending of the inner lead etc., whereby it is not necessary to carry out another bending step after the resin sealing step, to simplify the fabrication steps after resin sealing.

Further, the lead frame according to the present invention has a configuration which is applicable to fabrication of the aforementioned semiconductor device.

In addition, the inventive method of fabricating a lead frame is capable of fabricating the aforementioned lead frame.

According to the inventive semiconductor device, as hereinabove described, the guide position for the outer lead from the resin block is relatively downwardly provided. Thus, the distance between the guide position for the outer lead and the junction part is reduced to facilitate ensurance of flatness of the junction part.

The inner lead can be easily connected with the semiconductor chip since the inner and outer leads are upwardly and downwardly bent respectively, while the resin thickness can be sufficiently increased in the portion above the lead since the guide position for the outer lead from the resin block is downwardly provided. Therefore, no problem of partial separation between the lead and the resin block etc. is caused even if the resin thickness is reduced in a position upwardly beyond the semiconductor chip.

In the first or second method of fabricating a semiconductor device according to the present invention, the guide frame of the lead frame, the suspending lead and the die pad being held by the same are flush with each other. Therefore, registration accuracy is improved in the die bonding step of fixing the semiconductor chip and the wire bonding step of connecting the semiconductor chip with the inner lead, whereby absolutely no incomplete junction is caused in the fabrication steps.

Particularly in the first method, the outer lead is bent simultaneously with bending of the inner lead etc., whereby it is not necessary to carry out another bending step after the resin molding step, to simplify the fabrication steps after resin molding.

Further, the lead frame according to the present invention has a configuration applicable to fabrication of the aforementioned semiconductor device.

In addition, the inventive method of fabricating a lead frame is capable of fabricating a lead frame having the aforementioned advantages.

Therefore, a first object of the present invention is to ensure flatness of junction parts of outer leads with a simple structure.

A second object of the present invention is to enable increase in thickness of a resin part.

A third object of the present invention is to cause absolutely no incomplete junction in fabrication steps.

A fourth object of the present invention is to simplify fabrication steps following resin molding.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 illustrates a die bonding step;

DESCRIPTION OF THE PREFERRED EMBODIMENTS

Structure of Semiconductor Device

Figure 1:
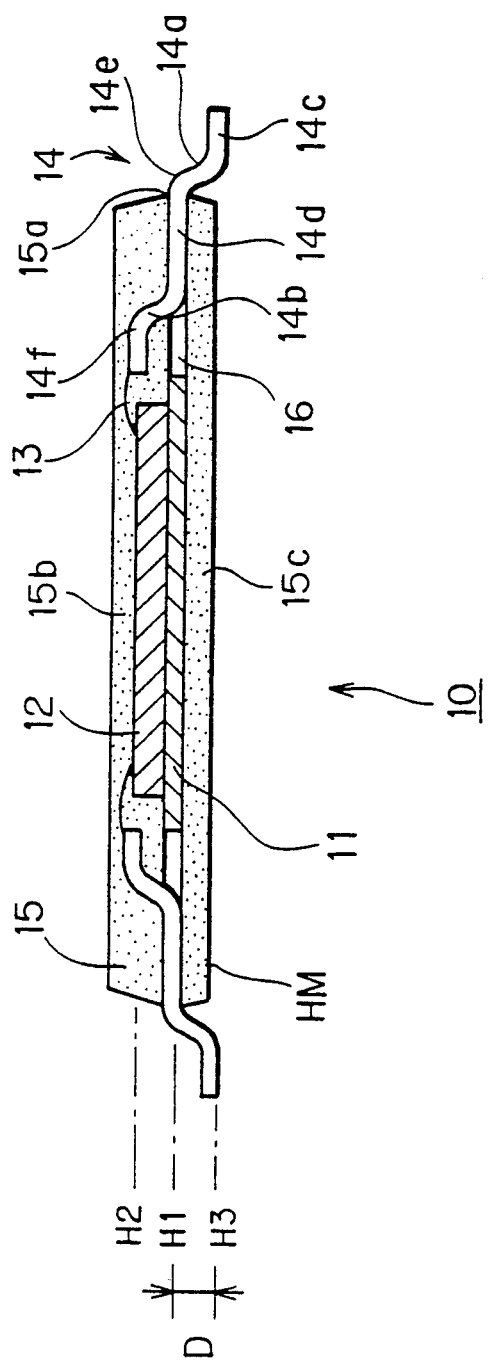
FIG. 1 is a longitudinal sectional view showing a semiconductor device according to a preferred embodiment of the present invention.
Figure 2:
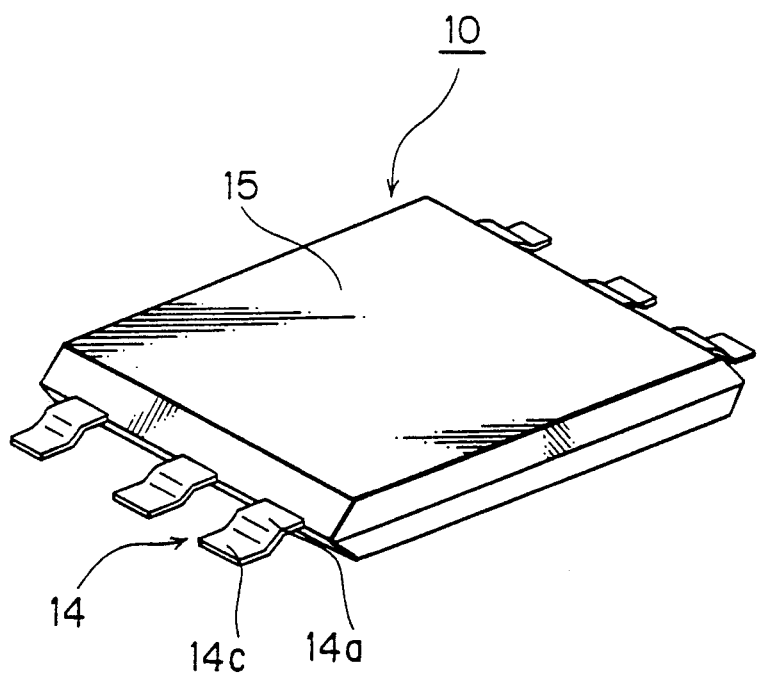
FIG. 2 is a general perspective view showing the semiconductor device according to the embodiment.

FIG. 1 is a longitudinal sectional view showing a semiconductor device 10 according to a preferred embodiment of the present invention, and FIG. 2 is a general perspective view showing the semiconductor device 10.

The semiconductor device has a die pad 11, a semiconductor chip 12 which is die-bonded onto the upper surface of the die pad 11, and a plurality of connection leads 14 which are connected to the semiconductor chip 12 through wires 13. Each connection lead 14 is formed by an outer lead 14a and an inner lead 14b. The semiconductor device further has a resin block 15, which integrally covers the members 10 to 13 and the inner leads 14b.

Each outer lead 14a is downwardly bent in a position substantially horizontally extending from a side end position of the resin block 15, and its forward end portion is further substantially horizontally bent to form a junction part 14c on a level H3 which is lower than the lower surface of the resin block 15. Each outer lead 14, whose junction parts 14c are aligned on the same plane of the level H3, correspond to the so-called gal wing leads. The junction parts 14c are joined onto a wiring board (not shown) by soldering of a lap joint system, so that the semiconductor device 10 is surface- mounted on the wiring board.

Each inner lead 14b is formed by a first part 14d which is connected with the outer lead 14a, and a second part 14f which is upwardly bent to substantially horizontally extend from the first part 14d. The first part 14d is located on a level H1 which is substantially flush with the die pad 11 and a die pad suspending lead 16. The second part 14f substantially horizontally extends on a level H2 which is substantially flush with the upper major surface of the semiconductor chip 12.

In this semiconductor device 10, a guide position 15a for each outer lead 14a from the resin block 15 is lower than the semiconductor chip 12. Therefore, it is possible to shorten a vertical length D between the guide position 15a and the junction part 14c of each outer lead 14a. Thus, flatness of the junction part 14c is hardly influenced by bending accuracy on a shoulder part 14e of each outer lead 14a, whereby it is possible to work the lead in high accuracy. Due to the short length of the outer lead 14a, the moment applied thereto is also reduced to increase rigidity of the outer lead 14a.

Due to such a structure of the connection lead 14, each inner lead 14b can be easily wire-bonded to the semiconductor chip 12.

Figure 14:
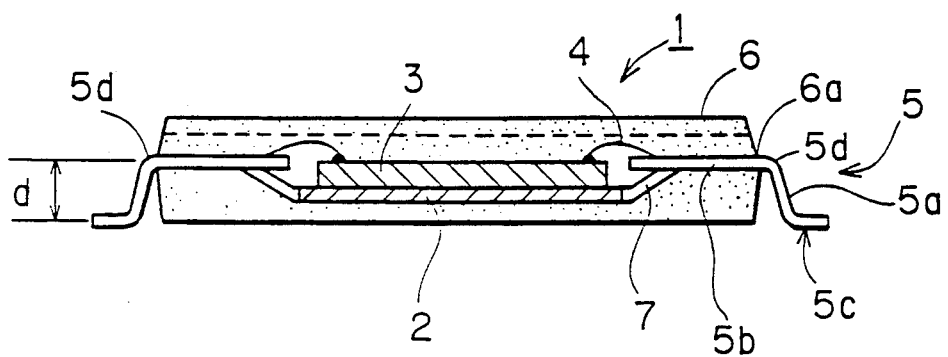
FIG. 14 is a longitudinal sectional view showing a conventional semiconductor device.
Figure 15:
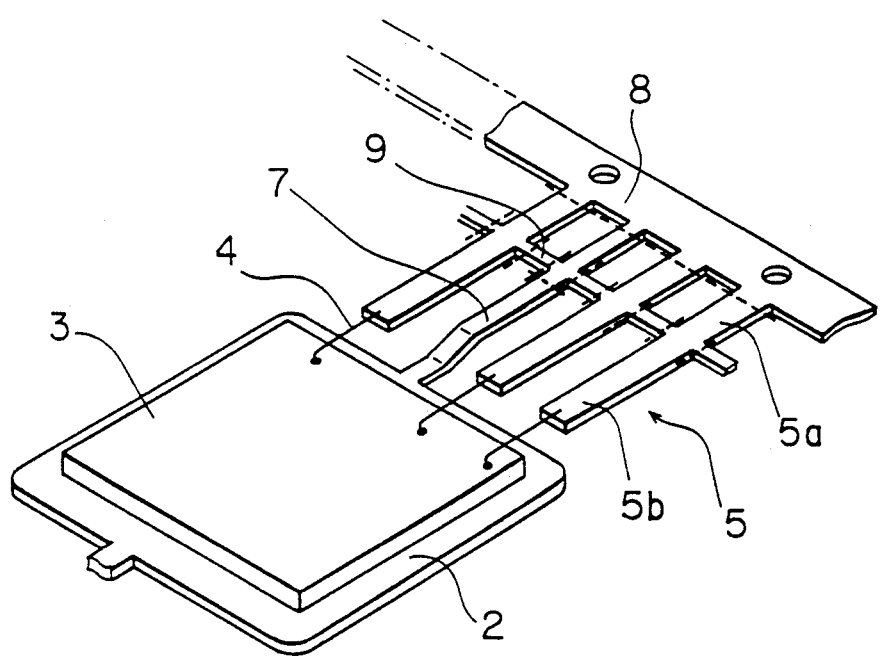
FIG. 15 is a perspective view showing the conventional semiconductor device after a wire bonding step.

Further, since the guide position 15a of the resin block 15 for each outer lead 14a is lower than the upper major surface of the semiconductor chip 12, it is possible to take a sufficient thickness in a resin portion above the guide position 15a even if this resin portion is reduced in thickness. Even if relatively strong force is applied from above to the resin block 15, therefore, it is possible to prevent partial separation of the connection lead 14 and the resin block 15 in the vicinity of the guide position 15a while reducing the thickness of the resin block 15 as a whole. In the semiconductor device 10 shown in FIG. 1, the thickness of a resin portion 15b provided above the upper major surface of the semiconductor chip 12 is substantially identical to the thickness of a resin portion 15c provided under the lower major surface of the chip 12 in practice, while the overall thickness of the resin block 15 is smaller than that of the conventional device shown in FIG. 14.

First Method of Fabricating Semiconductor Device 10

(1) Lead Frame Forming Step

Figure 3:
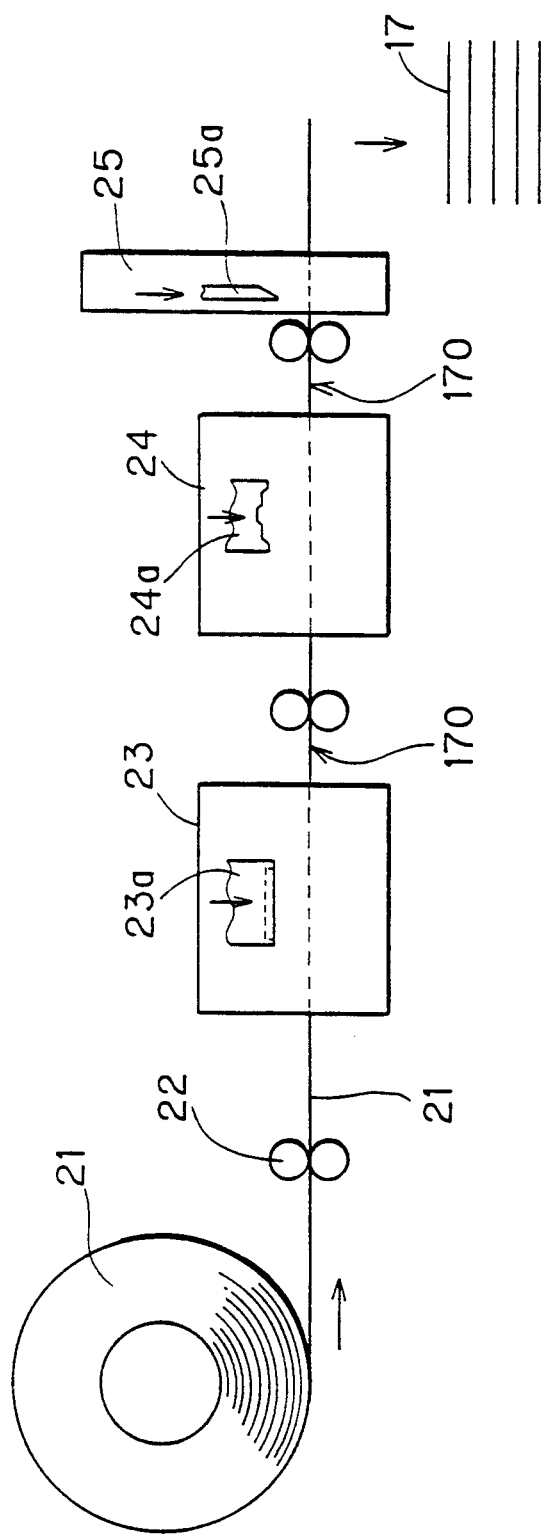
FIG. 3 schematically illustrates a lead frame forming step.

FIG. 3 schematically shows steps of fabricating a lead frame which is employed for obtaining the semiconductor device 10.

A rolled metal ribbon 21 of a Cu alloy or an Fe-Ni alloy is drawn out through drawing rollers 22, and fed to a stamping device 23.

Figure 4:
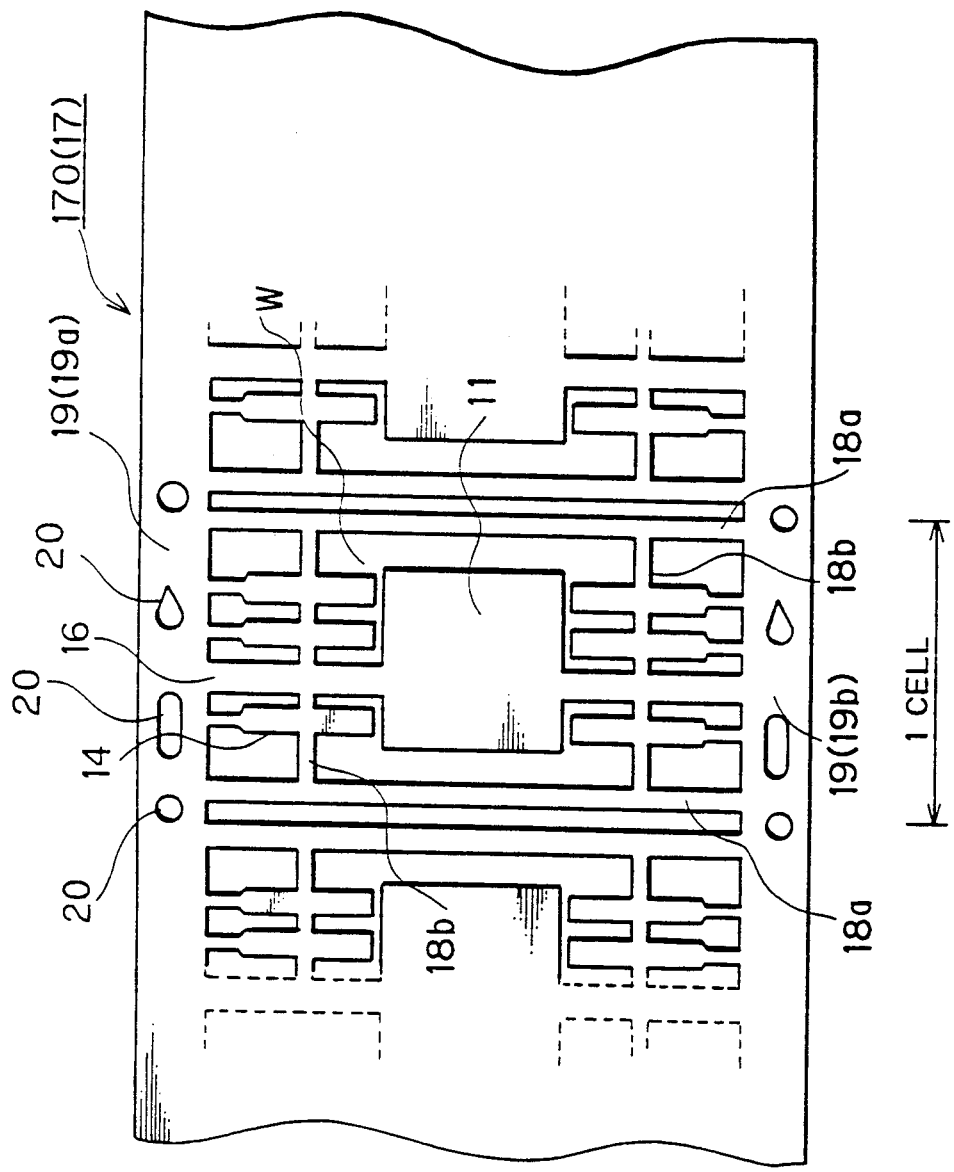
FIG. 4 illustrates the configuration of a stamped lead frame.

The stamping device 23 presses the metal ribbon 21 with a prescribed trimming die 23, to form a flat lead frame ribbon 170, which is partially shown in FIG. 4.

As shown in FIG. 4, this lead frame ribbon 170 comprises a guide frame 19 having a window W. The guide frame 19 is formed by a pair of frame strips 19a and 19b which are parallel to each other, and a plurality of first tie bars 18a extend in parallel across these frame strips 19a and 19b. Further, a plurality of second tie bars 18b extend across these first tie bars 18a. in parallel with the guide frame 19.

The guide frame 19 is provided with guide holes 20 for guiding the lead frame ribbon 170 in order to facilitate registration in each fabrication step as described below.

A suspending lead 16 for holding a die pad 11 in the window W extends from the guide frame 19. While this suspending lead 16 directly extends from the guide frame 19 in the example shown in FIG. 4, the same may alternatively extend from the tie bars 18a or 18b. In either case, the suspending lead 16 is directly or indirectly coupled to the guide frame 19.

The guide frame 19 is further coupled with a plurality of connection leads 14 which extend in the window W through paths which are different from that of the suspending lead 16. Also the connection leads 14 may alternatively extend from the tie bars 18a or 18b, to be directly or indirectly coupled to the guide frame 19. Forward ends of the connection leads 14 are aligned with each other in the vicinity of the die pad 11. The tie bars 18a and 18b are adapted to intercouple the suspending lead 16 and the connection leads 14 with each other so that the major surfaces thereof are not misaligned.

The unit, i.e., one cell of the lead frame ribbon 170 is formed by one die pad 11 and the aforementioned respective parts incidental thereto. The stamping device 23 forms one-dimensional arrangement of a number of such cells in the lead frame ribbon 170.

The stamping device 23 may stamp the lead frame ribbon 170 a plurality of times with various configurations of trimming dies.

The lead frame ribbon 170 provided with a number of cells is fed to a bending device 24 shown in FIG. 3. This bending device 24 presses the lead frame ribbon 170 with a prescribed die 24a to bend the connection lead 14, thereby working the lead frame ribbon 170 into the configuration shown in FIG. 5.

Figure 5:
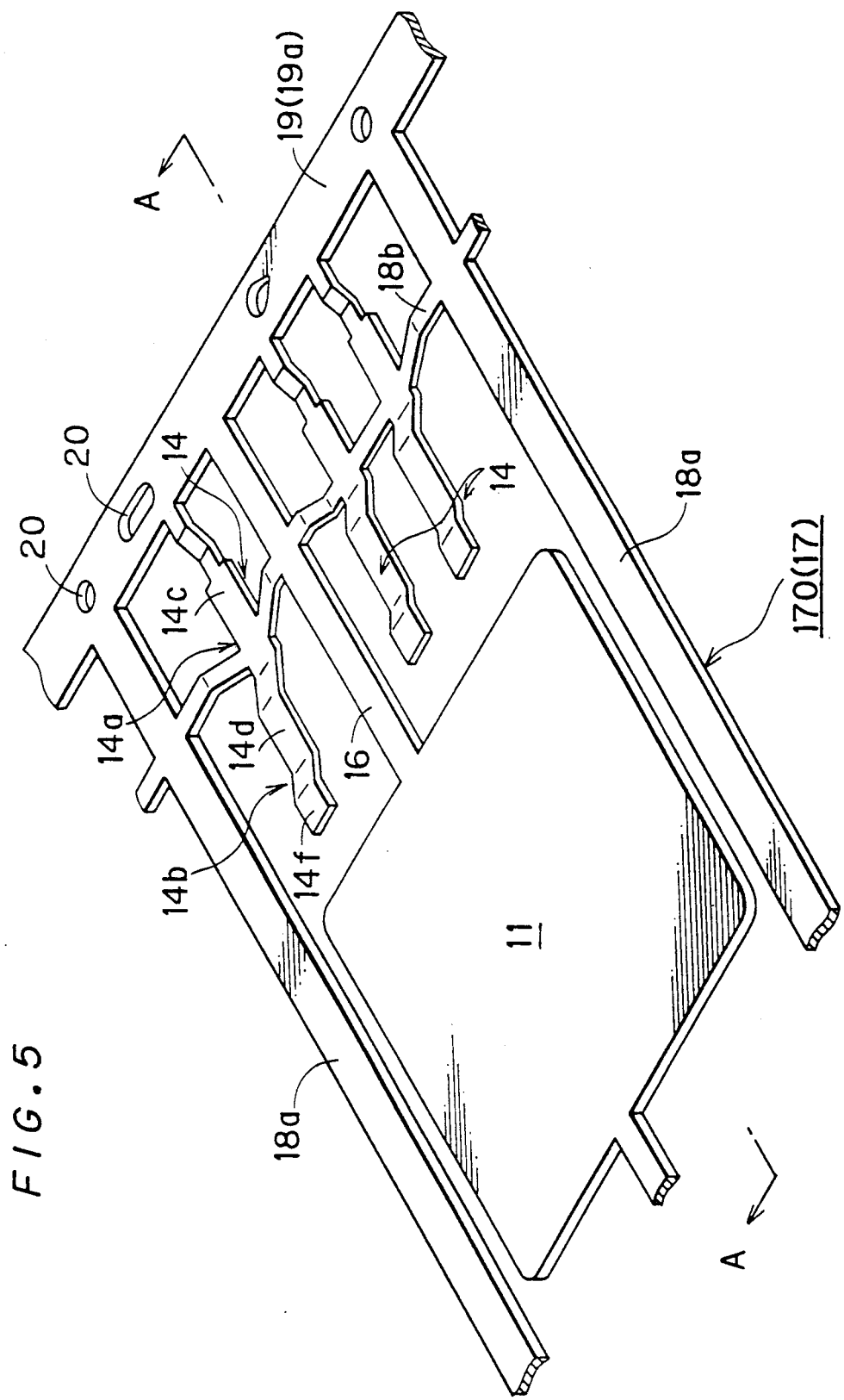
FIG. 5 is a perspective view showing a bent lead frame.
Figure 6:
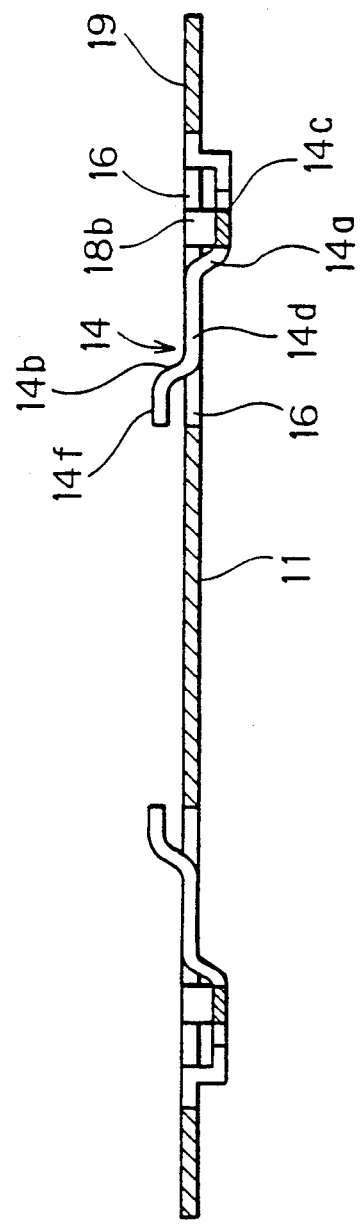
FIG. 6 is a longitudinal sectional view taken along the line A—A in FIG. 5.

FIG. 6 is a sectional view taken along the line A—A in FIG. 5. Each part of the connection lead 14 which is closer to the die pad 11 is defined as an inner lead 14b, while each part which is closer to the guide frame 19 is defined as an outer lead 14a.

A central horizontal part of the connection lead 14, i.e., a first part 14d of each inner lead 14b, is flush with the guide frame 19 and the die pad 11.

An end portion of each inner lead 14b is upwardly bent to define a substantially horizontal second part 14f. The upper surface of the second part 14f is made to be substantially flush with the upper surface of the semiconductor chip 12 when the die pad 11 is mounted thereon. A boundary portion between the first part 14d of each inner lead 14b and each outer lead 14a is downwardly bent so that the body portion of the outer lead 14a is lower than the die pad 11.

With such bending of the connection lead 14, the central portion of each tie bar 18b is also downwardly bent.

When such lead bending is completed, a cutter 25a of a cutting device 25 cuts the lead frame ribbon 170 every plurality of (e.g., 200) cells, to obtain lead frames 17.

The surface of each such lead frame 170 is plated with gold or the like for improvement of corrosion resistance, electric connectability and the like, and the process is advanced to a subsequent die bonding step.

(2) Die Bonding Step

In the die bonding step, a solder foil 27 (FIG. 7) is stuck onto the upper surface of the die pad 11, and heated to about 350° C. to be melted. Then, a semiconductor chip 12 whose lower major surface 12a is metallized with a metal such as Ni or Au by vacuum deposition or plating is placed on the solder foil 27, which in turn is solidified to fix the semiconductor chip 12 onto the upper surface of the die pad 11.

Such solder connection may be replaced by connection employing conductive resin.

After the die bonding step, the process is advanced to a step (wire bonding step) of connecting the semiconductor chip 12 with the connection lead 14 through wires 13.

(3) Wire Bonding Step

While the following wire bonding step is carried out by thermosonic bonding, this step may alternatively be carried out by another method such as ultrasonic bonding.

Figure 8A:
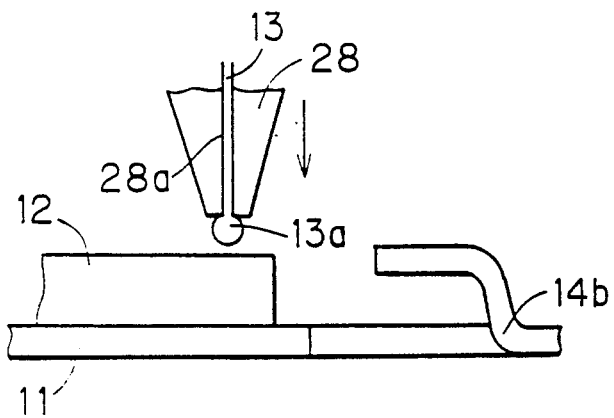
FIGS. 8A to 8D illustrate a wire bonding step.
Figure 8B:
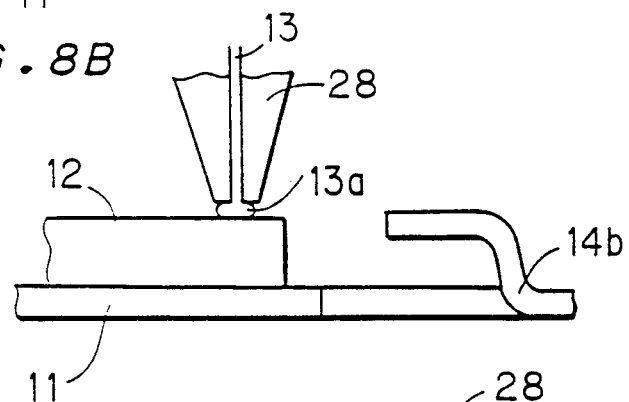

Referring to FIG. 8A, each Au wire 13 is guided through a guide hole 28a which is provided in a bonding tool 28, and the forward end of this wire 13 is melted by hydrogen flame to define a ball part 13a. The forward end of the bonding tool 28 is heated to a temperature of about 300° C. and the ball part 13a is pressed against an electrode portion of the semiconductor chip 12, thereby connecting the wire 13 to the electrode part of the semiconductor chip 12 (FIG. 8B).

Figure 8C:
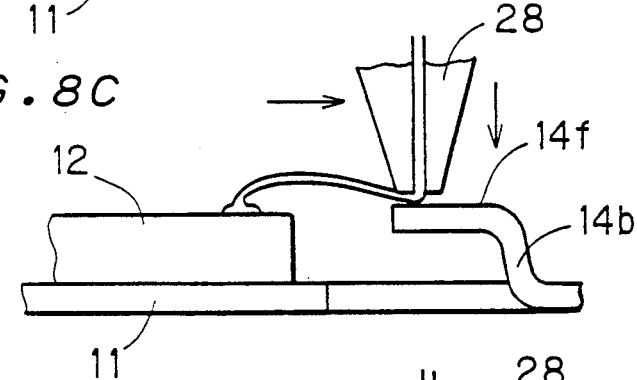

Then, the bonding tool 28 is moved to a position above the second part 14f of each inner lead 14b and each wire 13 is heated and pressed against each inner lead 14b, to be connected with the inner lead 14b (FIG. 8C).

Figure 8D:
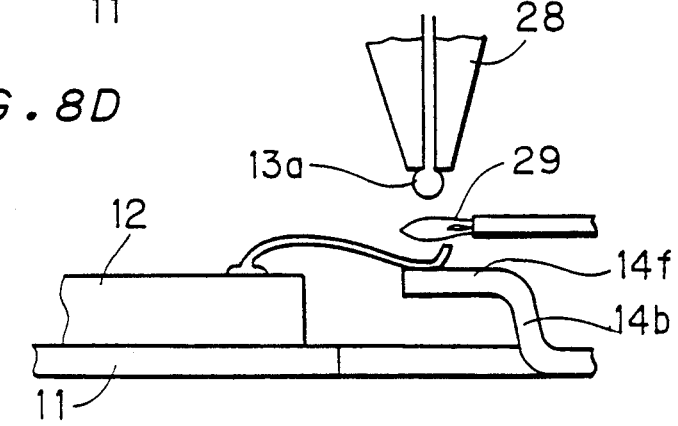

Finally the bonding tool 28 is raised up and an excess part of each wire 13 is cut with hydrogen flame 29 (FIG. 8D).

Figure 9:
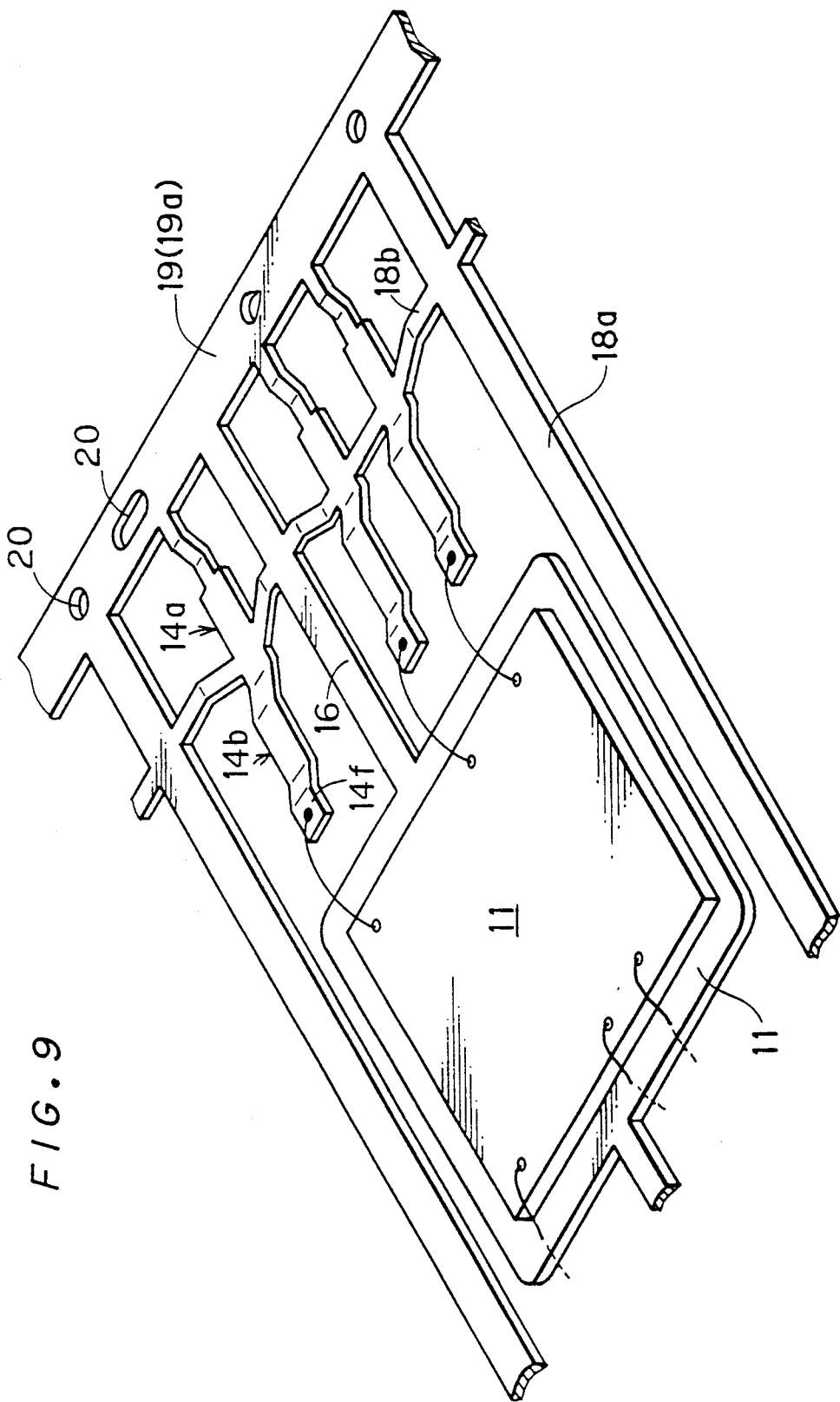
FIGS. 9 is a perspective view showing a semiconductor device after the wire bonding step.

FIG. 9 shows such a wire-bonded state.

The guide frame 19, the suspending lead 16 and the die pad 11 can be regularly flush with each other since the same are not bent in the aforementioned die bonding and wire bonding steps. Therefore, the die pad 11 is reliably guided by the guide frame 19 to be easily registered, to enable accurate working in each step.

The die bonding and wire bonding steps are carried out every cell of the lead frame 17, and the process is advanced to a subsequent molding step after all cells are processed.

(4) Molding Step

Figure 10:
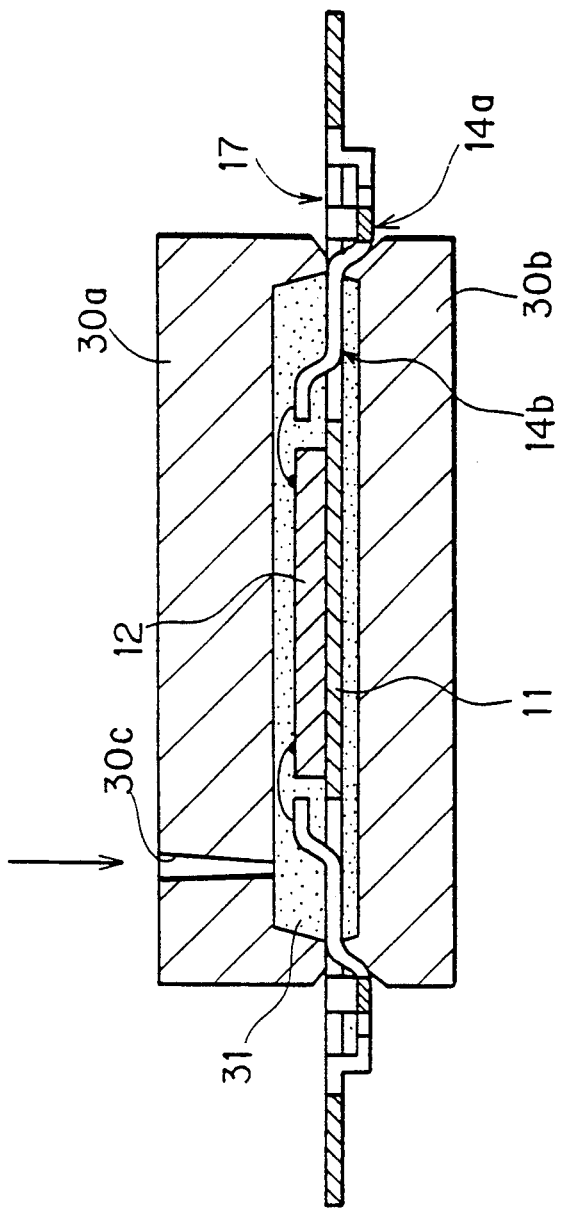
FIG. 10 illustrates a molding step.

In the molding step, the central portion of the lead frame 17 and the semiconductor chip 12 are covered with upper and lower dies 30a and 30b which are provided therein with molds as shown in FIG. 10, and the dies 30a and 30b are closed so that epoxy resin 31 is injected from a gate 30c which is provided in the upper die 30a.

Figure 11:
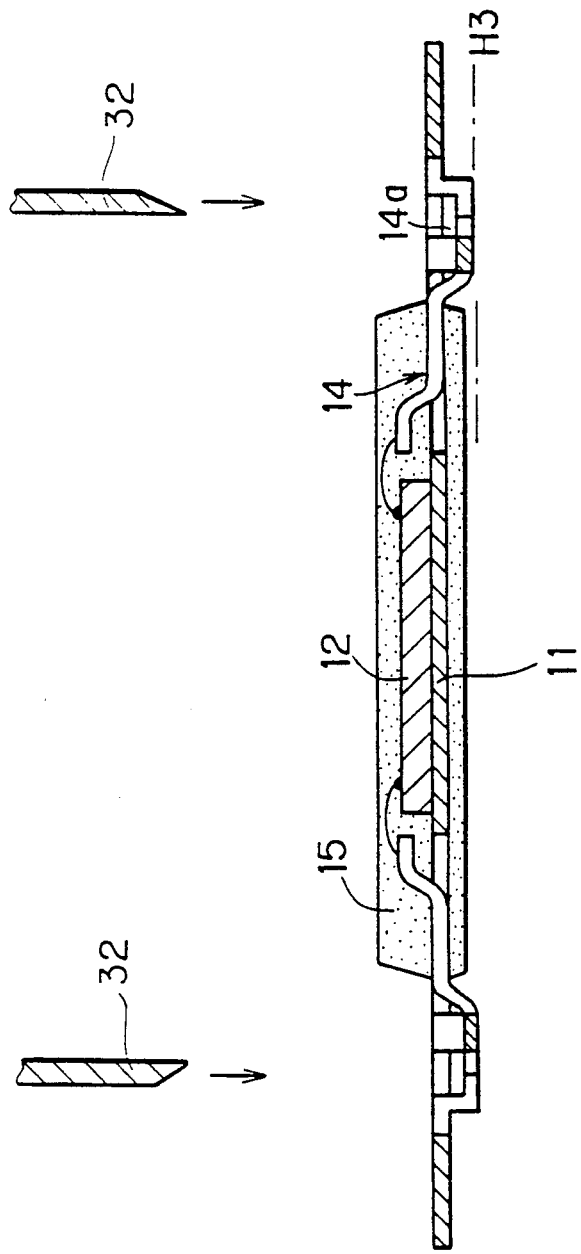
FIG. 11 illustrates a lead cutting step.

After the epoxy resin 31 is solidified, the upper and lower dies 30a and 30b are detached to obtain the as-molded resin block 15, as shown in FIG. 11. The lower surface of the resin block 15 is higher than the level H3 of each outer lead 14a.

(5) Lead Cutting Step

Figure 12:
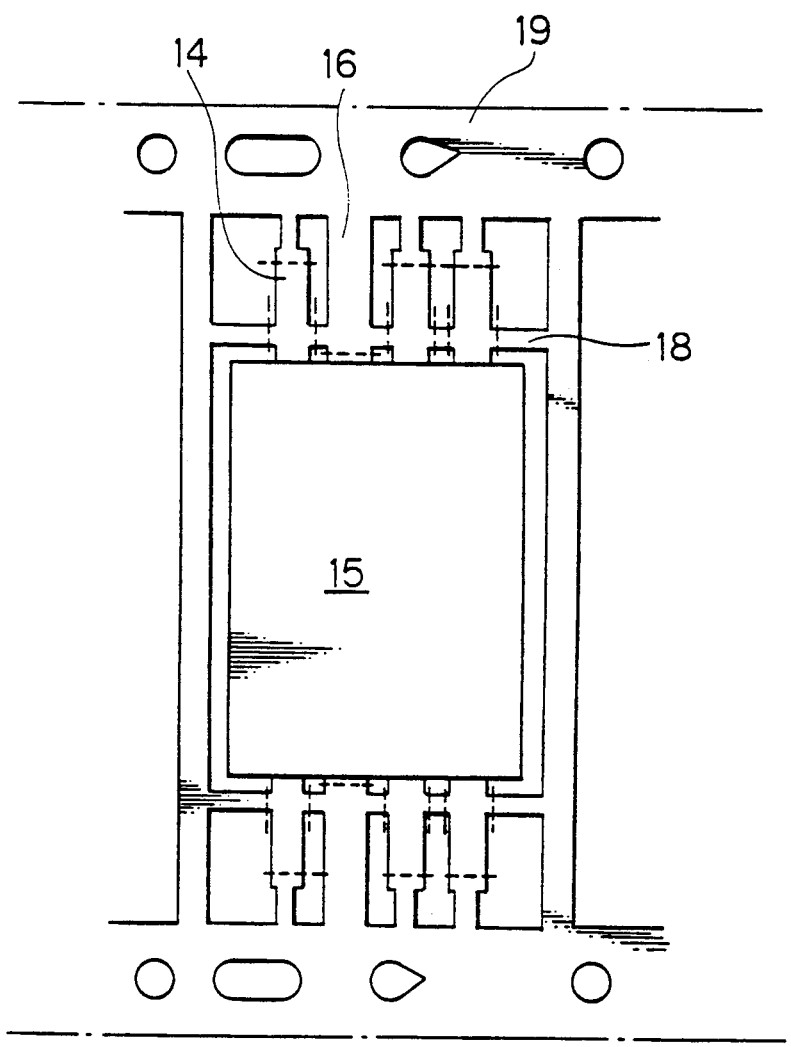
FIG. 12 illustrates lead cut portions.

In the final lead cutting step, the connection lead 14 is cut from the guide frame 19 by a cutter 32. At the same time, the connection lead 14 is cut from the tie bars 18, and portions of the suspending lead 16 which are located in the interior and the exterior of the resin block 15 are cut from each other (FIG. 11). FIG. 12 is a top plan view showing such a semi-finished state of the semiconductor device shown in FIG. 11. Referring to FIG. 12, lead cut portions are shown by broken lines.

Thus, the semiconductor device 10 is finally completed as shown in FIGS. 1 and 2.

In the first fabrication method, the process after the resin sealing step is simplified since no lead bending step is carried out after this step.

Second Fabrication Method

Figure 13:
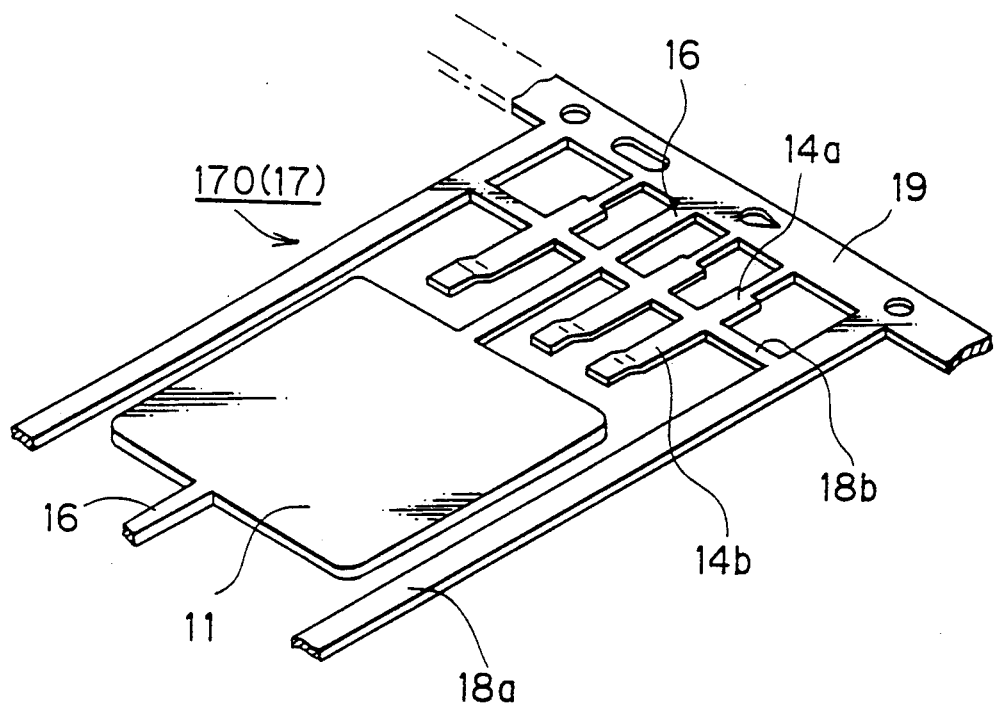
FIG. 13 illustrates the configuration of a lead frame whose outer leads are not bent in lead frame bending.

In a second method according to the present invention, only the inner leads 14b are upwardly bent by pressing in the lead frame forming step. Therefore, the lead frame ribbon 170 has a configuration shown in FIG. 13 after completion of the lead frame forming step. Then, die bonding, wire bonding and resin sealing steps are carried out.

Thereafter the outer leads 14a are downwardly bent before or after the lead cutting step. Contents of other steps in the second fabrication method are identical to those of the first fabrication method.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   (a) a die pad;
   (b) a semiconductor chip having upper and lower major surfaces, said lower major surface being fixed onto said die pad;
   (c) a connection lead having:
      (c-1) an inner lead being arranged in a side space of said semiconductor chip and having a first part being located on a first level being lower than said upper major surface of said semiconductor chip and a second part extending from an end of said first part to be upwardly bent and being located on a second level being higher than said first level, said second chip being electrically connected to said semiconductor chip, and
      (c-2) an outer lead extending from the other end of said first part of said inner lead to be downwardly bent; and
   (d) a resin block sealing said die pad, said semiconductor chip and said inner lead with resin;
   wherein:
   said second level is substantially equal to the level of said upper major surface of said semiconductor chip;
   said outer lead has:
      (c-2-1) a part which is bent on a third level being lower than said first level as well as the level of the lower surface of said resin block; and
   said first level is substantially equal to the level of said die pad.

2. A semiconductor device in accordance with claim 1, wherein said resin block comprises:
   (d-1) a first resin part being provided on said upper major surface of said semiconductor chip and having a first thickness; and
   (d-2) a second resin part being provided under said lower major surface of said semiconductor chip and having a second thickness;
   said first thickness being substantially equal to said second thickness.

3. A semiconductor device in accordance with claim 2, further comprising:
   (e) a wire for connecting said semiconductor chip with said second part of said inner lead.

4. A lead frame comprising:
   (a) a guide frame having a window;
   (b) a suspending lead being coupled to said guide frame to extend in said window;
   (c) a die pad being supported in said window by said suspending lead;
   (d) an outer lead being coupled to said guide frame to extend in said window through a path being different from that of said suspending lead; and (e) an inner lead comprising elements of:
  (e-1) a first part having an end being coupled to said outer lead to be located on a first level; and
  (e-2) a second part extending from the other end of said first part and being upwardly bent to be located on a second level being higher than said first level;
said outer lead comprises:
  (d-1) a part extending from said second part of said inner lead to be downwardly bent and being further bent on a third level which is lower than said first level;
wherein:
  said first level is substantially equal to the level of said die pad.

5. A lead frame in accordance with claim 4, further comprising:
  (f) a tie bar for intercoupling said suspending lead with said outer lead.

* * * * *